United States Patent
Shiu et al.

(10) Patent No.: US 8,216,946 B2
(45) Date of Patent: Jul. 10, 2012

(54) PATTERNING METHOD

(75) Inventors: Wei-Cheng Shiu, Taoyuan County (TW); Hai-Han Hung, Taoyuan County (TW); Ya-Chih Wang, Taipei County (TW); Chien-Mao Liao, Taipei County (TW); Shing-Yih Shih, Taipei County (TW)

(73) Assignee: Nanya Technology Corporation, Taoyuan (TW)

( * ) Notice: Subject to any disclaimer, the term of this patent is extended or adjusted under 35 U.S.C. 154(b) by 487 days.

(21) Appl. No.: 12/490,311

(22) Filed: Jun. 23, 2009

(65) Prior Publication Data

US 2010/0323521 A1 Dec. 23, 2010

(51) Int. Cl.
*H01L 21/302* (2006.01)
(52) U.S. Cl. ........ 438/705; 438/694; 438/697; 438/753; 438/689; 438/692; 216/41; 216/57; 216/87; 216/89
(58) Field of Classification Search .................. None
See application file for complete search history.

(56) References Cited

U.S. PATENT DOCUMENTS 6,596,642 B2 * 7/2003 Wu et al. ...................... 438/705
7,129,152 B2 * 10/2006 Fehlhaber et al. ............ 438/483

OTHER PUBLICATIONS

H. Xiao, Introduction to Semiconductor Manufacturing Technology, published by Prentice Hall, 2001, ISBN 0-13-022404-9, pp. 150-152.*

* cited by examiner

*Primary Examiner* — Lan Vinh
*Assistant Examiner* — Jiong-Ping Lu
(74) *Attorney, Agent, or Firm* — Jianq Chyun IP Office

(57) ABSTRACT

A patterning method has a mask layer and undoped patterns sequentially formed on a target layer. A doping process is performed to surfaces of the undoped patterns to form doped patterns from the surfaces of the undoped patterns. A material is filled in the gaps between the doped patterns. A portion of the doped patterns are then removed to expose the top surfaces of the remaining undoped patterns. The material and the exposed undoped patterns are removed. A portion of the mask layer is removed using the remaining doped patterns as a mask to form a first pattern on the mask layer. A portion of the target layer is removed using the mask layer having the first pattern thereon as a mask so as to form on the target layer a second pattern complementary to the first pattern.

32 Claims, 3 Drawing Sheets

PATTERNING METHOD

BACKGROUND OF THE INVENTION

1. Field of Invention

This invention relates to a patterning method for a target layer.

2. Description of Related Art

In manufacture of integrated circuit, photolithography processes are performed to transfer patterns from photomasks having customized circuit patterns thereon to thin films formed on a wafer. A patterning process comprises forming a photoresist layer on a target layer, exposing the photoresist layer by a photomask having customized circuit patterns thereon, developing the photoresist layer and etching the target layer using the patterned photoresist layer as a mask. For a typical IC product manufacturing process, such patterning process is performed several times to transfer circuit patterns to some layers.

Conventionally, to increase the integration degree of devices without being limited by the resolution of the optical tool, a double patterning process is developed. In a double patterning process, a mask layer is formed on the target layer and patterned twice using different photomasks. In other words, the steps of photoresist coating, exposure, development and etching are repeatedly in sequence to transfer two different groups of patterns to the mask layer. Thus, the patterns of the patterned mask layer have a smaller line width than that of the patterns on any of the photomasks. Then, the target layer is patterned using the patterned mask layer as a mask, so as to transfer the patterns of the patterned mask layer to the target layer. In this way, a device formed from the target layer has a reduced line width.

However, since the procedure of the conventional double patterning process is complex, the cycle time and cost of the IC manufacturing process are increased.

SUMMARY OF THE INVENTION

This invention provides a patterning method to make a reduced line width.

The present invention provides a patterning method. A mask layer and a plurality of undoped patterns are sequentially formed on a target layer. A doping process is performed to surfaces of the undoped patterns, so as to form a plurality of doped patterns from the surfaces of the undoped patterns. A material is filled in the gaps between the doped patterns. A portion of the doped patterns are then removed to expose the top surfaces of the remaining undoped patterns. The material and the exposed undoped patterns are removed. A portion of the mask layer is removed using the remaining doped patterns as a mask to form a first pattern on the mask layer. A portion of the target layer is removed using the mask layer having the first pattern thereon as a mask so as to form on the target layer a second pattern complementary to the first pattern.

The present invention further provides a patterning method. A plurality of undoped patterns is formed on a target layer. A doping process is performed to surfaces of the undoped patterns, so as to form a plurality of doped patterns from the surfaces of the undoped patterns. A material is filled in the gaps between the doped patterns. A portion of the doped patterns are then removed to expose the top surfaces of the remaining undoped patterns, wherein the material and the exposed undoped patterns are complementary to the remaining doped patterns. The material and the exposed undoped patterns are removed. A portion of the target layer is removed using the remaining doped patterns as a mask so as to form on the target layer a pattern complementary to the remaining doped patterns.

According to an embodiment of this invention, the undoped patterns and the doped patterns include polysilicon.

According to an embodiment, the dopant used in the doping process includes argon(Ar), boron difluoride($BF_2$), boron (B), phosphorus(P) or arsenic(As), for example.

According to an embodiment, the material includes silicon oxide, silicon nitride, silicon oxynitride, metal oxide, metal nitride, metal oxynitride or metal silicide, for example.

According to an embodiment, the gaps filling step includes forming a material layer to cover the doped patterns and fill the gaps between the doped patterns, and partially removing the material layer to expose the top surfaces of the doped patterns.

According to an embodiment, the step of removing the portion of the doped patterns to expose the top surfaces of the remaining undoped patterns includes performing a CMP process, for example.

According to an embodiment, the step of removing the material and the exposed undoped patterns includes performing a first etching process to remove the material, and performing a second etching process to remove the exposed undoped patterns.

According to an embodiment, the first etching process has a first etching selectivity ratio of 10~100 with respect to the material and the exposed undoped patterns and a second etching selectivity ratio of 10~100 with respect to the material and the remaining doped patterns.

According to an embodiment, the material includes silicon oxide and the undoped patterns and the doped patterns comprise polysilicon, and the first etching process is performed using an HF-based etching solution.

According to an embodiment, the second etching process has an etching selectivity ratio of 10~100 with respect to the exposed undoped patterns and the remaining doped patterns.

According to an embodiment, the undoped patterns and the doped patterns include polysilicon, and the second etching process is performed using a solution comprising $NH_4OH$, TMAH (tetramethylammonium hydroxide) or KOH.

In this invention, by doping surfaces of the undoped patterns to form the doped patterns and removing a portion of the doped patterns to expose the top surfaces of the remaining undoped patterns, the doped patterns can have a reduced line width. Thus, by using the doped patterns as a mask to pattern the mask layer, the patterns in the patterned mask layer have a reduced line width. As a result, a device defined by the patterned mask layer has a reduced line width. Accordingly, a reduced line width can be achieved with a relatively simple process, so that the cycle time of the process is greatly decreased and the process window control is better.

In order to make the aforementioned and other objects, features and advantages of this invention comprehensible, a preferred embodiment accompanied with figures is described in detail below.

DESCRIPTION OF EMBODIMENTS

FIGS. 1A-1G are schematic cross-sectional views illustrating a patterning method according to an embodiment of this invention.

Figure 1A:
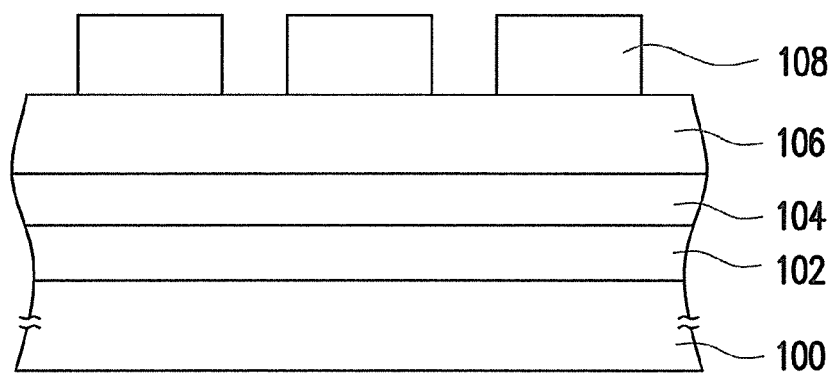
FIGS. 1A-1G are schematic cross-sectional views illustrating a patterning method according to an embodiment of this invention.

Referring to FIG. 1A, a mask layer 104, an undoped layer 106 and a patterned photoresist layer 108 are sequentially formed on a target layer 102 that is formed on a substrate 100. The substrate 100 may be a semiconductor substrate, such as a silicon substrate. The target layer 102 may be a stacked structure, or a single layer such as a dielectric layer or a conductive layer. The mask layer 104 includes TEOS-$SiO_2$, BPSG, PS, HSQ, FSG or USG, for example. The undoped layer 106 includes polysilicon, for example. The target layer 102, the mask layer 104 and the undoped layer 106 are formed by chemical vapor deposition (CVD) processes, for example.

Figure 1B:
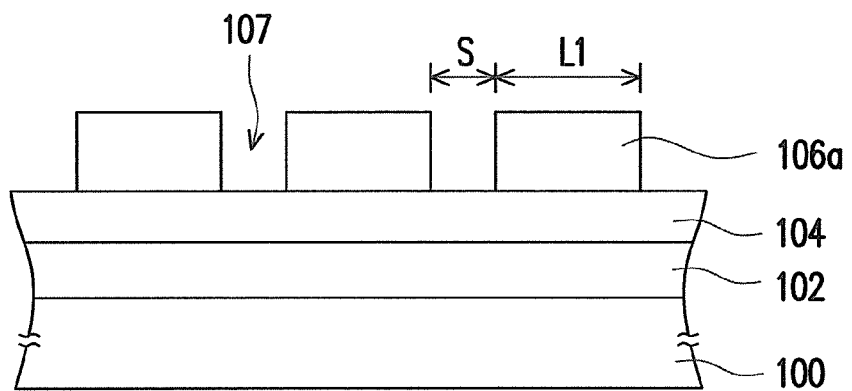

Referring to FIG. 1B, a portion of the undoped layer 106 is removed, using the patterned photoresist layer 108 as a mask to form a plurality of undoped patterns 106a. Thereafter, the patterned photoresist layer 108 is removed. In this embodiment, all undoped patterns 106a have the same line width L1 and all gaps 107 between the undoped patterns 106a have the same space width S, for example.

Figure 1C:
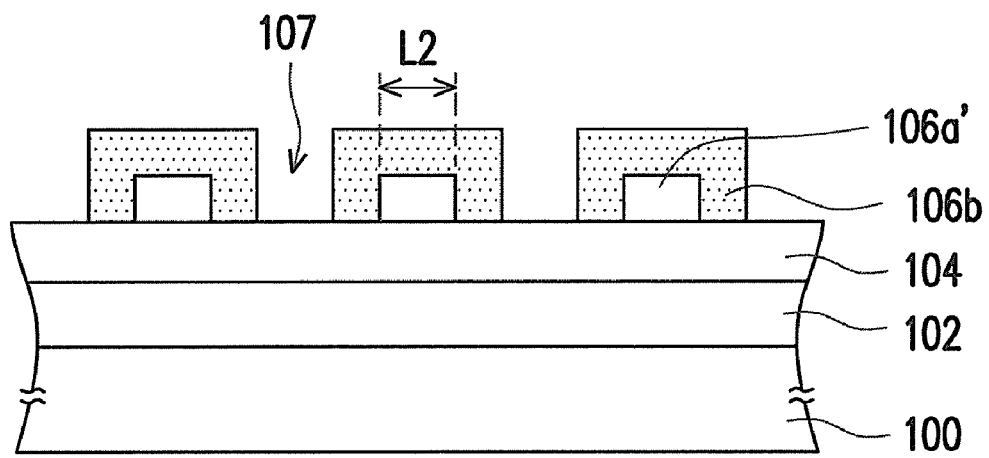

Referring to FIG. 1C, a doping process is performed to surfaces of the undoped patterns 106a, so as to form a plurality of doped patterns 106b from the surfaces of the undoped patterns 106a. The doping process is an ion implantation process, for example. The dopant used in the doping process includes argon(Ar), boron difluoride($BF_2$), boron(B), phosphorus(P) or arsenic(As), for example. In this embodiment, the remaining undoped patterns 106a' include polysilicon and the doped patterns 106b include doped polysilicon. It is noted that the dopant species, dosage, implantation tilt angle, doping energy and other parameters in the doping process can be adjusted to control the dopant distribution as well as the line width L2 of the remaining undoped patterns 106a'. In this embodiment, the dimension of the line width L2 of the remaining undoped patterns 106a' is close to the dimension of the space width S of the gaps 107, for example.

Figure 1D:
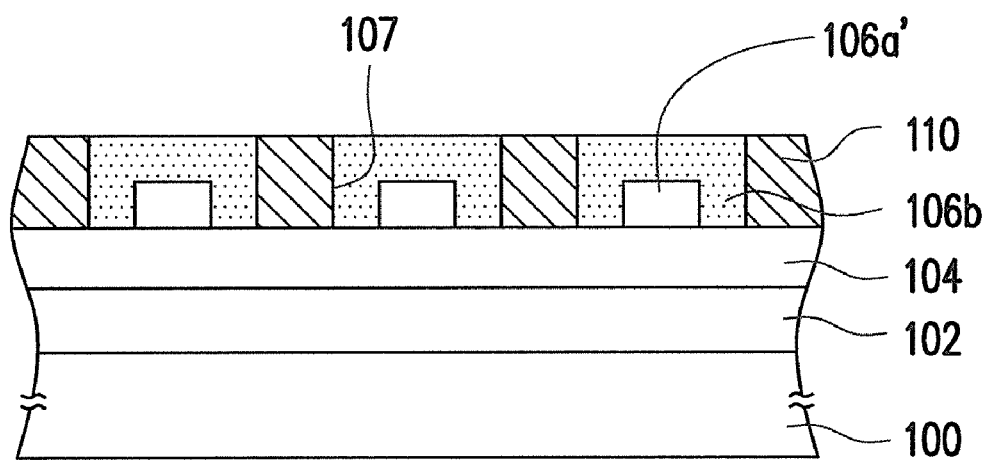

Referring to FIG. 1D, a material 110 is filled in the gaps 107 between the doped patterns 106b. The method of filling the material 110 may include the following steps. A material layer (not shown) is formed covering the doped patterns 106b and filling the gaps 107 between the doped patterns 106b. Then, an etching-back process or a CMP process is performed to remove a portion of the material layer and expose the top surfaces of the doped patterns 106b. The material 110 may include an insulating material or a conductive material, such as silicon oxide, silicon nitride, silicon oxynitride, metal oxide, metal nitride, metal oxynitride or metal silicide. In particular, the material 110 and the material of the remaining undoped patterns 106a' or the doped patterns 106b have a high etching selectivity ratio. For example, when the doped patterns 106b and the remaining undoped patterns 106a' include polysilicon, the material 110 may include silicon oxide to make a high etching selectivity ratio.

Figure 1E:
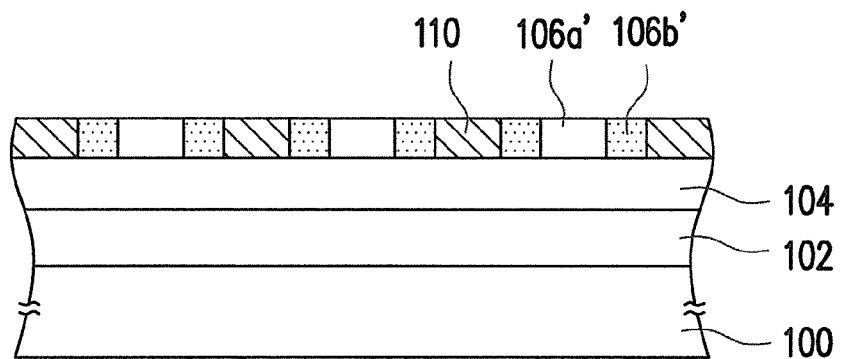

Referring to FIG. 1E, a portion of the material 110 and a portion of the doped patterns 106b are then removed to expose the top surfaces 114 of the remaining undoped patterns 106a' and to form the remaining doped patterns 106b', wherein the material 110 and the exposed undoped patterns 106a' are complementary to the remaining doped patterns 106b'. In this embodiment, a portion of the material 110 and a portion of the doped patterns 106b are removed by a CMP process, for example. In addition, forming the material 110 and exposing the top surfaces of the remaining undoped patterns 106a' can be done in one process, such as one CMP process. That is, after a material layer (not shown) is formed covering the doped patterns 106b and filling the gaps 107 between the doped patterns 106b, a portion of the material layer and a portion of the doped patterns 106b are removed in one CMP process, using the top surfaces of the doped patterns 106b as an end point and over-polish to remove top portion of the doped patterns 106b.

Figure 1F:
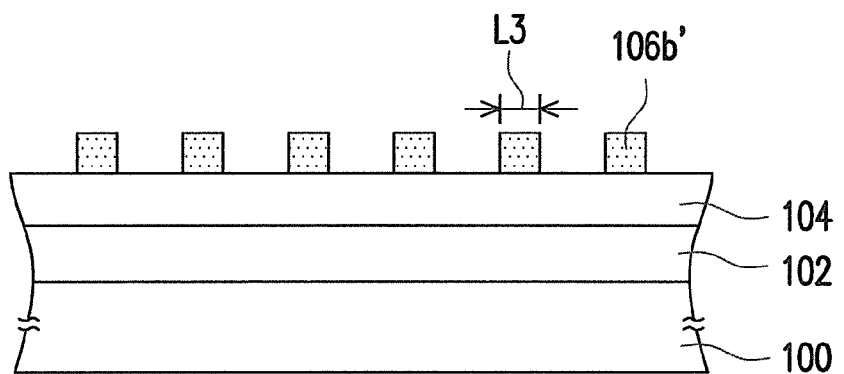

Referring to FIG. 1F, the material 110 and the exposed undoped patterns 106a' are removed, so that only the doped patterns 106b remain on the mask layer 104. The step of removing the material 110 and the exposed undoped patterns 106a' may include performing a first etching process to remove the material 110 and then performing a second etching process to remove the exposed undoped patterns 106a'. The first etching process has a first etching selectivity with respect to the material 110a and the exposed undoped patterns 106a' and a second etching selectivity with respect to the material 104 and the remaining doped patterns 106b', and the second etching process has a third etching selectivity with respect to the exposed undoped patterns 106a' and the remaining doped patterns 106b'. For example, when the material 104 include silicon oxide and the undoped patterns 106a' and the remaining doped patterns 106b' include polysilicon, the first etching process can be performed using an HF-based etching solution and the second etching process can be performed using a solution containing $NH_4OH$, TMAH (tetramethylammonium hydroxide) or KOH. It is noted that the line width L3 of the remaining doped patterns 106b' can be smaller than the line width L1 of the undoped patterns 106a shown in FIG. 1B.

Figure 1G:
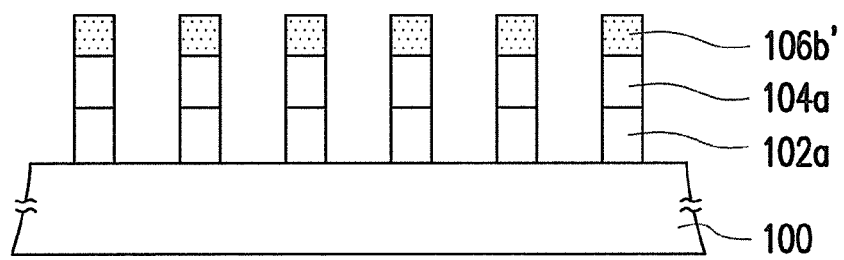

Referring to FIG. 1G, a portion of the mask layer 104 is removed using the remaining doped patterns 106b' as a mask to form a patterned mask layer 104a. Thereafter, a portion of the target layer 102 is removed, using the patterned mask layer 104a as a mask, to form a patterned target layer 102a. It is noted that by using the patterned mask layer 104a as a mask, the patterns of the patterned target layer 102a have a reduced line width.

In this embodiment, by converting surfaces of the undoped patterns 106a into the doped patterns 106b, exposing the top surfaces of the remaining doped patterns 106a' and then removing the remaining undoped patterns 106a', the remaining doped patterns 106b' have a line width smaller than that of the undoped patterns 106a defined by the patterned photoresist layer 108. Accordingly, a reduced line width can be made with a relatively simple procedure with existing machines and processes. Therefore, the cycle time of the process is decreased and the process window control is better.

In summary, by doping surfaces of the undoped patterns to form the doped patterns and using the doped patterns as a mask to pattern the mask layer after the undoped patterns are removed, the patterns of the patterned mask layer have a reduced line width. Thus, with existing machines and processes, the line width of the devices formed from the patterned target layer defined by the patterned mask layer can be smaller than that of the devices directly defined by a patterned photoresist.

In other words, the patterning method of this invention can reduce the line width without replacing existing machines and photoresists, so that the cost is greatly reduced and the process window is wider. Further, the steps of the patterning process flow is reduced and the overall process flow is simple, so that the process window control is better.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A patterning method, comprising:
   forming a mask layer and a plurality of undoped patterns sequentially on a target layer;
   performing a doping process to surfaces of the undoped patterns to form a plurality of doped patterns from the surfaces of the undoped patterns;
   filling gaps between the doped patterns with a material;
   removing a portion of the doped patterns to expose top surfaces of the remaining undoped patterns;
   removing the material and the exposed undoped patterns;
   removing a portion of the mask layer, using the remaining doped patterns as a mask, to form a first pattern on the mask layer; and
   removing a portion of the target layer using the mask layer having the first pattern thereon as a mask so as to form on the target layer a second pattern complementary to the first pattern.

2. The patterning method of claim 1, wherein the undoped patterns and the doped patterns comprise polysilicon.

3. The patterning method of claim 1, wherein a dopant used in the doping process comprises argon(Ar), boron difluoride (BF$_2$), boron (B), phosphorus(P) or arsenic(As).

4. The patterning method of claim 1, wherein the material comprises silicon oxide, silicon nitride, silicon oxynitride, metal oxide, metal nitride, metal oxynitride or metal silicide.

5. The patterning method of claim 1, wherein the gaps filling step comprises:
   forming a material layer to cover the doped patterns and fill the gaps between the doped patterns; and
   partially removing the material layer to expose the top surfaces of the doped patterns.

6. The patterning method of claim 1, wherein the step of removing the portion of the doped patterns to expose the top surfaces of the remaining undoped patterns comprises performing a CMP process.

7. The patterning method of claim 1, wherein the step of removing the material and the exposed undoped patterns comprises:
   performing a first etching process to remove the material; and
   performing a second etching process to remove the exposed undoped patterns.

8. The patterning method of claim 7, wherein the first etching process has a first etching selectivity ratio of 10~100 with respect to the material and the exposed undoped patterns and a second etching selectivity ratio of 10~100 with respect to the material and the remaining doped patterns.

9. The patterning method of claim 8, wherein the material comprise silicon oxide and the undoped patterns and the doped patterns comprise polysilicon, and the first etching process is performed using an HF-based etching solution.

10. The patterning method of claim 7, wherein the second etching process has an etching selectivity ratio of 10~100 with respect to the exposed undoped patterns and the remaining doped patterns.

11. The patterning method of claim 10, wherein the undoped patterns and the doped patterns comprise polysilicon, and the second etching process is performed using a solution comprising NH$_4$OH, TMAH (tetramethylammonium hydroxide) or KOH.

12. A patterning method, comprising forming a mask layer on a target layer, patterning the mask layer and removing a portion of the target layer using the patterned mask layer as a mask, and characterized in that the step of patterning the mask layer comprises:
   forming a plurality of undoped patterns on the mask layer;
   performing a doping process to surfaces of the undoped patterns to form a plurality of doped patterns from the surfaces of the undoped patterns;
   filling gaps between the doped patterns with a material;
   removing a portion of the doped patterns to expose top surfaces of the remaining undoped patterns;
   removing the material and the exposed undoped patterns; and
   removing a portion of the mask layer, using the remaining doped patterns as a mask, to form the patterned mask layer.

13. The patterning method of claim 12, wherein the undoped patterns and the doped patterns comprise polysilicon.

14. The patterning method of claim 12, wherein a dopant used in the doping process comprises argon(Ar), boron difluoride(BF$_2$), boron (B), phosphorus(P) or arsenic(As).

15. The patterning method of claim 12, wherein the material comprises silicon oxide, silicon nitride, silicon oxynitride, metal oxide, metal nitride, metal oxynitride or metal silicide.

16. The patterning method of claim 12, wherein the gaps filling step comprises:
   forming a material layer to cover the doped patterns and fill the gaps between the doped patterns; and
   partially removing a portion of the material layer to expose the top surfaces of the doped patterns.

17. The patterning method of claim 12, wherein the step of removing the portion of the doped patterns to expose the top surfaces of the remaining undoped patterns comprises performing a CMP process.

18. The patterning method of claim 12, wherein the step of removing the material and the exposed undoped patterns comprises:
   performing a first etching process to remove the material; and
   performing a second etching process to remove the exposed undoped patterns.

19. The patterning method of claim 18, wherein the first etching process has a first etching selectivity ratio of 10~100 with respect to the material and the exposed undoped patterns and a second etching selectivity ratio of 10~100 with respect to the material and the remaining doped patterns.

20. The patterning method of claim 19, wherein the material comprise silicon oxide and the undoped patterns and the doped patterns comprise polysiliconand the first etching process is performed using an HF-based etching solution.

21. The patterning method of claim 18, wherein the second etching process has an etching selectivity ratio of 10~100 with respect to the exposed undoped patterns and the remaining doped patterns.

22. The patterning method of claim 21, wherein the undoped patterns and the doped patterns comprise polysilicon, and the second etching process is performed using a solution comprising NH$_4$OH, TMAH (tetramethylammonium hydroxide) or KOH.

23. A patterning method, comprising:
   forming a plurality of undoped patterns on a target layer;
   performing a doping process to surfaces of the undoped patterns to form a plurality of doped patterns from the surfaces of the undoped patterns;
   filling gaps between the doped patterns with a material;
   removing a portion of the doped patterns to expose top surfaces of the remaining undoped patterns, wherein the material and the exposed undoped patterns are complementary to the remaining doped patterns;

removing the material and the exposed undoped patterns; and removing a portion of the target layer using the remaining doped patterns as a mask so as to form on the target layer a pattern complementary to the remaining doped patterns, wherein the step of removing the portion of the doped patterns to expose the top surfaces of the remaining undoped patterns comprises performing a CMP process.

24. The patterning method of claim 23, wherein the undoped patterns and the doped patterns comprise polysilicon.

25. The patterning method of claim 23, wherein a dopant used in the doping process comprises argon(Ar), boron difluoride($BF_2$), boron (B), phosphorus(P) or arsenic(As).

26. The patterning method of claim 23, wherein the material comprises silicon oxide, silicon nitride, silicon oxynitride, metal oxide, metal nitride, metal oxynitride or metal silicide.

27. The patterning method of claim 23, wherein the gaps filling step comprises:

forming a material layer to cover the doped patterns and fill the gaps between the doped patterns; and partially removing the material layer to expose the top surfaces of the doped patterns.

28. The patterning method of claim 23, wherein the step of removing the material and the exposed undoped patterns comprises:

performing a first etching process to remove the material; and performing a second etching process to remove the exposed undoped patterns.

29. The patterning method of claim 28, wherein the first etching process has a first etching selectivity ratio of 10~100 with respect to the material and the exposed undoped patterns and a second etching selectivity ratio of 10~100 with respect to the material and the remaining doped patterns.

30. The patterning method of claim 29, wherein the material comprise silicon oxide and the undoped patterns and the doped patterns comprise polysilicon, and the first etching process is performed using an HF-based etching solution.

31. The patterning method of claim 28, wherein the second etching process has an etching selectivity ratio of 10~100 with respect to the exposed undoped patterns and the remaining doped patterns.

32. The patterning method of claim 31, wherein the undoped patterns and the doped patterns comprise polysilicon, and the second etching process is performed using a solution comprising $NH_4OH$, TMAH (tetramethylammonium hydroxide) or KOH.

* * * * *